United States Patent [19]

Purohit et al.

[11] Patent Number: 4,978,577

[45] Date of Patent: Dec. 18, 1990

[54] METHOD FOR PREPARING LAMINATES OF ZNSE AND ZNS

[75] Inventors: Parul V. Purohit, Woburn; Jeffery L. Kirsch, Tewksbury; James C. MacDonald, Stoneham, all of Mass.

[73] Assignee: CVD Incorporated, Woburn, Mass.

[21] Appl. No.: 337,026

[22] Filed: Apr. 12, 1989

[51] Int. Cl.$^5$ .............................................. B32B 9/00
[52] U.S. Cl. ................................... 428/409; 428/432; 428/688; 428/911; 428/913; 428/918; 156/153; 156/322; 427/224; 427/290
[58] Field of Search ............... 428/409, 432, 539, 688, 428/911, 913, 918; 156/153, 322; 427/224, 290

[56] References Cited

U.S. PATENT DOCUMENTS

| | | | |
|---|---|---|---|
| 4,072,782 | 2/1978 | Kramer et al. | 428/409 |
| 4,075,388 | 2/1978 | Doss | 428/409 |
| 4,303,635 | 12/1981 | Aldinger et al. | 423/561 |
| 4,447,469 | 5/1984 | Peters | 427/54.1 |
| 4,770,479 | 9/1988 | Tustison | 350/1.6 |

FOREIGN PATENT DOCUMENTS

| | | |
|---|---|---|
| 55-130804 | 10/1980 | Japan . |
| 55-130805 | 10/1980 | Japan . |
| 57-118004 | 7/1982 | Japan . |
| 59-146915 | 8/1984 | Japan . |
| 60-169562 | 9/1985 | Japan . |

*Primary Examiner*—Patrick Ryan
*Attorney, Agent, or Firm*—Gerald K. White

[57] ABSTRACT

An improved method of forming a ZnS layer on a ZnSe substrate by chemical vapor deposition of ZnS onto the ZnSe is disclosed in which the ZnS is contacted, prior to the chemical vapor deposition of the ZnS, with H$_2$S in the absence of zinc metal vapor to cause reaction of the H$_2$S and the surface of the ZnSe substrate.

10 Claims, No Drawings

METHOD FOR PREPARING LAMINATES OF ZNSE AND ZNS

BACKGROUND OF THE INVENTION

1. Field of the Invention

This invention relates generally to methods of preparing ZnSe/ZnS laminates or "sandwiches" by chemical vapor deposition techniques and the laminates so made.

2. Description of the Prior Art

Infrared transmissive windows are currently used at the entrance apertures of many airborne reconnaissance or navigation systems. Materials used for such windows have to satisfy several criteria, including (a) the window should not significantly decrease the incoming signal or render the signal noisy, and (b) the window material should be strong enough to withstand dust and rain erosion encountered during high speed flight. Zinc selenide (ZnSe), a highly transmissive material in the infrared region, satisfies criterion (a) very well and is thus considered an ideal candidate for such window applications. However ZnSe is a "soft" material (hardness about 120 knoop, flexural strength about 8000 psi) which does not effectively resist rain and dust erosion during high speed flight. Zinc sulfide (ZnS), also an infrared transmissive material, does not have the superior optical properties of zinc selenide but is much stronger (hardness about 240 knoop, flexural strength about 15,000 psi), and is capable of withstanding the conditions of high speed flight at least up to about Mach No 1

It is known that a layer of ZnS about 1 mm thick deposited on ZnSe is sufficient to produce a window with rain erosion resistance equivalent to that of pure ZnS without a significant loss in the optical properties of the ZnSe. However, there are problems associated in making such a ZnSe/ZnS "sandwich". One of the main problems is the production of a strong bond between the ZnSe and ZnS layers. Previous attempts at making such a sandwich frequently resulted in products in which the ZnS layer peeled off during polishing and fabrication procedures. Thus, there has been a need for a process by which ZnSe/ZnS sandwiches can be made which have a strongly adherent bond between the ZnSe substrate and the ZnS layer.

One attempt at such a process has been to chemically etch the ZnSe substrate prior to applying the ZnS layer. While the transmission properties of the resulting sandwich were not significantly affected, the strength of the bond between the ZnSe and ZnS layers was not improved.

U.S. Pat. No. 4,303,635, issued Dec. 1, 1981 to Aldinger, et al. discloses optical grade zinc sulfide bodies made by the chemical vapor deposition (CVD) technique. They are subjected to an after treatment under high gas pressure and at elevated temperature. While the CVD technique in general is disclosed, the zinc sulfide bodies are not formed on a ZnSe substrate, so the problem of bond strength is not addressed.

U.S Pat. No. 4,447,469, issued May 8, 1984 to Peters, discloses a low temperature process for depositing, e.g., ZnS on a substrate by reacting a vapor phase reactant (e.g. dimethyl zinc) and neutral, charge-fee sulfur atoms.

U.S. Pat. No. 4,770,479, issued Sept. 13, 1988 to Tutison, and U.S. Pat. No. 4,772,080, issued Sept. 20, 1988 to Tutison generally disclose the production of optical windows of ZnSe or ZnS by the CVD method.

Japanese Patent No. J5 5130-804 disclose ZnSe prepared by reacting hydrogen and selenium vapor to produce hydrogen selenide which is in turn reacted with zinc vapor by a CVD method to produce a ZnSe article.

Japanese Patent No. J5 5130-805 discloses the production of ZnSe by mixing zinc and selenium vapors which causes deposition of ZnSe.

Japanese Patent No. J5 9146-915A discloses a process in which metallic zinc is directed toward a substrate while a sulfur and/or selenium compound gas is supplied, so that ZnS and/or ZnSe is adhered to the substrate.

Japanese Patent No. J5 7118-004 discloses a process in which hydrogen selenide is diluted with an inactive gas and is supplied to a reaction tube in a high temperature furnace. An inactive carrier gas is directed onto molten zinc so that zinc vapor is obtained to grow ZnSe on a substrate.

Japanese Patent No. J6 0169-562-A a method for making infrared transmitting materials of ZnS-ZnSe having excellent adherence to a substrate when subjected to heat cycles. A mixed crystal layer is formed at the interface between the ZnS and ZnSe which is effective in improving the adherence of the ZnS to the ZnSe. The process involves placing a ZnSe board into a CVD synthesis furnace and introducing zinc vapor together with $H_2S$ gas and $H_2Se$ gas. The flow rate of the $H_2Se$ is varied from 100% $H_2SE$ to 0% $H_2Se$ (100% $H_2S$), after which only $M_2S$ is present.

SUMMARY OF THE INVENTION

In accordance with the present invention, there is provided an improved method of forming a ZnS layer on a ZnSe substrate by the chemical vapor deposition of ZnS onto the ZnSe in which the improvement comprises contacting a ZnSe substrate, prior to the chemical vapor deposition of the ZnS, with $H_2S$ in the absence of zinc metal vapor at a temperature and for a time sufficient to cause a reaction of the $H_2S$ with the surface of the ZnSe substrate.

Also provided in accordance with this invention is a method of forming a ZnS layer on a ZnSe substrate by the chemical vapor deposition of ZnS onto the ZnSe, said method comprising:

A. heating a ZnSe substrate in a chemical vapor deposition chamber, in the absence of zinc metal vapor, to a temperature sufficient to cause a reaction between the ZnSe and $H_2S$;

B. contacting the ZnSe with $H_2S$, in the absence of zinc metal vapor, until the $H_2S$ reacts with the surface of the ZnSe; and C. introducing zinc metal vapor into the chamber in the presence of $H_2S$ and depositing a layer of ZnS onto the ZnSe by chemical vapor deposition.

There is also provided in accordance with this invention, a method of improving the adherence of a chemical vapor deposited layer of ZnS to a ZnSe substrate which comprises, prior to depositing the ZnS onto the ZnSe contacting the ZnSe with $H_2S$, in the absence of zinc metal vapor, at a temperature and for a time sufficient to cause the $H_2S$ to react with the ZnSe.

Further provided in accordance with this invention are the products produced by the above processes In accordance with the present invention there is further provided an infrared optical element comprising a ZnSe substrate having a ZnS layer deposited onto the surface of sail substrate by chemical vapor deposition, wherein the surface of the ZnSe substrate has been reacted with H$_2$S prior to the deposition of the ZnS whereby the surface of said substrate is roughened.

Also provided according to the present invention is an improved infrared optical element comprising a ZnSe substrate having a ZnS layer deposited onto the surface of said substrate by chemical vapor deposition, the improvement comprising the surface of the ZnSe substrate having been reacted with H$_2$S prior to the deposition of the ZnS layer whereby the surface of said substrate is roughened.

DETAILED DESCRIPTION OF THE INVENTION

Articles comprising a ZnSe substrate with a ZnS layer or coating on it (sometimes called a "laminate" or "sandwich") can be made by chemical vapor deposition techniques. In general, this technique involves forming the ZnSe substrate by known chemical vapor deposition methods, shaping and polishing the ZnSe substrate, if desired, and then depositing the layer of ZnS onto the surface of the ZnSe substrate by chemical vapor deposition. The resulting "sandwich" is then shaped to a desired configuration and polished.

The present invention provides a method of making these ZnSe/ZnS "sandwiches" which improves the adhesion between the ZnSe and ZnS resulting in a stronger bond between the layers and fewer instances of delamination during fabrication of the final product. The increased adhesion between the ZnSe and ZnS layer is evidenced by the fact that, when tested for flexural strength, the "sandwiches" fracture across the bond rather than along it (as would be the case if adhesion between the layers were weak). One of the primary advantages of the present invention is that this increased adhesion is achieved more consistently than with known methods, thus increasing the yield of usable "sandwiches".

Another advantage of the present invention is that uniform growth of the ZnS layer on the ZnSe substrate is more consistently achieved than with known methods.

The method of the present invention essentially involves contacting a ZnSe substrate which in most cases is pre-formed) with H$_2$S at a temperature and for a time sufficient to cause the H$_2$S to react with the surface of the ZnSe substrate. While not limiting this invention by any particular theory, it is believed that the reaction of the H$_2$S and ZnSe removes oxygen and other contaminants from the surface of the ZnSe substrate and converts some of the ZnSe to ZnS.

The temperature employed in the method of this invention is not critical, it being only necessary that the temperature be high enough to permit the H$_2$S and ZnSe to react, i.e. about 200° C., and low enough that the ZnSe is not adversely affected.

It is essential to the present invention that the H$_2$S be allowed to react with the ZnSe in the absence of zinc metal vapor. This can be accomplished in two ways. The first is to physically confine the zinc metal vapor so that it can not contact the ZnSe or H$_2$S. This allows the ZnSe and H$_2$S to react at a temperature higher than the vaporization temperature of the zinc metal. The second, and preferred, method is to react the ZnSe and H$_2$S at a temperature below the vaporization temperature of the zinc metal, i.e. at about 419° C. to about 685° C. This permits the "sandwich" to be conveniently made by placing both the ZnSe and zinc metal (but not its vapor) in the same chemical vapor deposition chamber and reacting the ZnSe i H$_2$S in the presence of the zinc metal (but not any substantial amount of its vapor). Once the H$_2$S has reacted sufficiently with the ZnSe, the chemical vapor deposition of the ZnS may be begun simply by increasing the temperature of the chamber to vaporize the zinc metal.

The H$_2$S must be permitted to contact the ZnSe for a time sufficient to permit it to react with the ZnSe. As will be apparent to one skilled in the art, this reaction time can vary considerably depending upon the conditions (e.g., temperature, pressure, H$_2$S flow rate) employed in the chemical vapor deposition chamber. In general a minimum reaction time of about 2 hours will be required. One skilled in the art can readily determine the necessary reaction time under a particular set of conditions since the reaction of the ZnSe substrate and H$_2$S is accompanied by an etching or roughening of the surface of the ZnSe substrate which can be detected visually. Thus, if the ZnSe has been contacted with the H$_2$S long enough to detect etching or roughening of the surface of the ZnSe this provides an indication that reaction has occurred. While the H$_2$S may, of course tact the ZnSe for longer than the minimum time for the two to react without adverse consequences, such longer contact times do not provide any particular benefit.

In the commercial production of the ZnSe/ZnS "sandwiches" in accordance with the present invention determination of minimum reaction time is not a factor. In a typical commercial procedure the H$_2$S is allowed to contact the ZnSe substrate while the temperature of the chemical vapor deposition chamber is raised from about 419° C. (the melting point of zinc metal) to the deposition temperature of the zinc metal (about 685° C.). While this time will be different depending upon the particular equipment and procedures employed, in a typical commercial process it is more than sufficient to allow the H$_2$S and ZnSe to react.

The present invention is illustrated by the following example.

EXAMPLE a ZnSe substrate (which had been pre-formed by a conventional chemical vapor deposition method, shaped to a desired configuration and polished) was placed in a conventional vapor deposition chamber along with zinc metal. The chamber was Pumped down to vacuum and heated to about 300° C. A flow of argon into the chamber was begun while the temperature in the chamber was raised to about 600° C. No zinc vapor was present in the chamber. A flow of H$_2$S (along with argon) into the chamber was begun and continued for about 12 hours. No zinc vapor was present in the chamber during this time. The chamber temperature was raised to about 690° C. and a flow of zinc metal vapor (along with argon) into the chamber was begun while the flow of H$_2$S continued. ZnS was then deposited on the ZnSe substrate in a conventional manner.

The resulting ZnSe/ZnS "sandwich" had a strong bond between the ZnSe and ZnS layers and was fabricated and polished without delamination of the layers.

What is claimed is:

1. An infrared optical element comprising a ZnSe substrate having a ZnS layer deposited onto the surface of said substrate by chemical vapor deposition, wherein the surface of the ZnSe substrate has been reacted with $H_2S$ in the absence of zinc metal vapor prior to the deposition of the ZnS whereby the surface of said substrate is roughened.

2. In an infrared optical element comprising a ZnSe substrate having a ZnS layer deposited onto the surface of said substrate by chemical vapor deposition, wherein the improvement comprises the surface of the ZnSe substrate having been reacted with $H_2S$ prior to the deposition of the ZnS layer whereby the surface of said substrate is roughened.

3. In a method of forming a ZnS layer on a ZnSe substrate by the chemical vapor deposition of ZnS onto the ZnSe, the improvement comprising contacting a ZnSe substrate, prior to the chemical vapor deposition of the ZnS, with $H_2S$, in the absence of zinc metal vapor, at a temperature and for a time sufficient to cause a reaction of the $H_2S$ with the surface of the ZnSe substrate 4. The method of claim 3 wherein the reaction of the ZnSe substrate is followed by chemical vapor deposition of the ZnS.

5. The product produced by the method of claim 3.

6. The product produced by the method of claim 4.

7. A method of forming a ZnS layer on a ZnSe substrate by chemical vapor deposition of ZnS onto the ZnSe, said method comprising:
  A. heating a ZnSe substrate in a chemical vapor deposition chamber in the absence of zinc metal vapor to a temperature sufficient to cause a reaction between the ZnSe and $H_2S$;
  B. contacting the ZnSe substrate with $H_2S$, in the absence of zinc metal vapor, until the $H_2S$ reacts with the surface of the ZnSe; and
  C. introducing zinc metal vapor into the chamber in the presence of $H_2S$ and depositing a layer of ZnS onto the ZnSe by chemical vapor deposition.

8. The product produced by the method of claim 7.

9. A method of improving the adherence of a chemical vapor deposited layer of ZnS to a ZnSe substrate which comprises, prior to depositing the ZnS onto the ZnSe, contacting the ZnSe with $H_2S$ in the absence of zinc metal vapor at a temperature and for a time sufficient to cause the $H_2S$ to react with the ZnSe.

10. The product produced by the method of claim 9.

* * * * *